United States Patent
Wang et al.

(10) Patent No.: US 12,504,236 B2
(45) Date of Patent: Dec. 23, 2025

(54) LIQUID COOLING VAPOR CHAMBER HEAT DISSIPATION MODULE

(71) Applicant: TOP RANK TECHNOLOGY LIMITED, Apia (WS)

(72) Inventors: Tien-Lai Wang, Apia (WS); Tzu-Yu Wang, Apia (WS); Cheng-Yu Wang, Apia (WS); Meng-Yu Lee, Apia (WS)

(73) Assignee: TOP RANK TECHNOLOGY LIMITED, Apia (WS)

( * ) Notice: Subject to any disclaimer, the term of this patent is extended or adjusted under 35 U.S.C. 154(b) by 111 days.

(21) Appl. No.: 18/666,855

(22) Filed: May 17, 2024

(65) Prior Publication Data
US 2025/0003696 A1    Jan. 2, 2025

(30) Foreign Application Priority Data
Jun. 27, 2023   (TW) ................. 112123818

(51) Int. Cl.
| F28D 15/04 | (2006.01) |
| F28D 15/02 | (2006.01) |

(52) U.S. Cl.
CPC ....... F28D 15/046 (2013.01); F28D 15/0275 (2013.01)

(58) Field of Classification Search
CPC .............. F28D 15/046; F28D 15/0275; H05K 7/20336
See application file for complete search history.

(56) References Cited

U.S. PATENT DOCUMENTS

| 4,382,466 A * | 5/1983 | Shiraishi ............. F28D 15/0275 165/47 |
| 4,520,305 A * | 5/1985 | Cauchy ............... F28D 15/0275 310/306 |
| 6,105,662 A * | 8/2000 | Suzuki ................ F28D 15/0266 165/185 |
| 6,874,568 B2 * | 4/2005 | Lai ...................... H01L 23/4006 165/80.4 |
| 7,796,389 B2 * | 9/2010 | Edmunds ............ F28D 15/0233 361/679.52 |
| 10,299,406 B2 * | 5/2019 | Lin .................... H05K 7/20409 |
| 12,324,127 B2 * | 6/2025 | Dean .................. H05K 7/20327 |

(Continued)

*Primary Examiner* — Travis Ruby
(74) *Attorney, Agent, or Firm* — WPAT, PC

(57) ABSTRACT

A liquid cooling vapor chamber heat dissipation module includes a liquid cooling cover, a metallic top cover, and a metallic bottom cover. The liquid cooling cover includes a top portion, a sidewall and an accommodating space. The sidewall includes a liquid inlet and a liquid outlet. The outer heat-dissipating surface of the top cover has a plurality of columnar heat-dissipating structures. The inner evaporation surface of the metallic bottom cover has parallel bottom grooves and protrusive supporting structures disposed between the bottom grooves. An integrated vapor chamber is formed by engaging the metallic top and bottom covers. The liquid cooling cover engages with the outer heat-dissipating surface of the metallic top cover with the columnar heat-dissipating structures accommodating within the accommodating space, which allows cooling liquid to enter the accommodating space from the liquid inlet and flow through the columnar heat-dissipating structures, and flow out from the liquid outlet.

14 Claims, 7 Drawing Sheets

(56) References Cited

U.S. PATENT DOCUMENTS

| | | | | |
|---|---|---|---|---|
| 2006/0118280 A1* | 6/2006 | Liu | ......................... | F28F 3/022 |
| | | | | 165/104.33 |
| 2006/0162903 A1* | 7/2006 | Bhatti | ...................... | F28F 3/12 |
| | | | | 165/104.21 |
| 2008/0105413 A1* | 5/2008 | Peng | ..................... | F28F 13/185 |
| | | | | 165/104.33 |
| 2009/0025910 A1* | 1/2009 | Hoffman | ............... | F28D 15/046 |
| | | | | 165/104.21 |
| 2013/0126139 A1* | 5/2013 | Tsuruta | .................... | F28F 3/12 |
| | | | | 165/170 |
| 2014/0345832 A1* | 11/2014 | Lin | ....................... | F28D 15/046 |
| | | | | 165/104.26 |
| 2016/0209123 A1* | 7/2016 | Yee | .................... | F28D 15/0233 |
| 2016/0227672 A1* | 8/2016 | Lin | .................... | H05K 7/20254 |
| 2016/0330868 A1* | 11/2016 | Sun | ........................ | H01L 23/46 |
| 2017/0023307 A1* | 1/2017 | Wang | ................. | F28D 15/0233 |
| 2017/0292793 A1* | 10/2017 | Sun | ......................... | F28F 9/001 |
| 2020/0029466 A1* | 1/2020 | Long | ................. | H05K 7/20309 |
| 2020/0404802 A1* | 12/2020 | Takahashi | ................. | B32B 3/30 |
| 2021/0108860 A1* | 4/2021 | Kulkarni | ............. | F28D 15/0233 |
| 2022/0049905 A1* | 2/2022 | Pounds | .............. | F28D 15/0275 |
| 2023/0213288 A1* | 7/2023 | Wang | ........................ | F28F 3/02 |
| | | | | 165/104.26 |
| 2024/0298425 A1* | 9/2024 | Wang | ................... | H01L 23/427 |

\* cited by examiner

LIQUID COOLING VAPOR CHAMBER HEAT DISSIPATION MODULE

CROSS REFERENCE TO RELATED APPLICATION

This application claims the benefits of Taiwan application Serial No. 112123818, filed on Jun. 27, 2023, the disclosures of which are incorporated by references herein in its entirety.

TECHNICAL FIELD

The present disclosure relates in general to a vapor chamber heat dissipation module, and more particularly to a liquid cooling vapor chamber heat dissipation module.

BACKGROUND

The explosive development of generative artificial intelligence (Generative AI) or artificial intelligence generated content (AI Generated Content; AIGC) has greatly increased the development needs for high-speed computing power and high-end computing chip modules. The huge data volume and processing speed required by AIGC applications continue to drive the demand for high-end AI servers. High-end AI servers use a larger number of central processing units (CPUs) and graphics processing units (GPUs) at the same time. In order to cope with the high-speed and large-scale computing requirements of generative artificial intelligence (such as ChatGPT), the number of transistors contained in the chip the high-end AI servers used has reached 175 billion. Corresponding to the high efficiency and high power consumption of AI server chips, the accompanying great amount and high-density heat sources have become a major challenge to heat dissipation capabilities. For example, in 2018, the power consumption of the server processor was only about 180 W~280 W, but it is expected to increase to more than 500 W in 2023. For example, the 5 nm process Genoa processor launched by AMD's and the A100 chip launched by GPU manufacturer NVIDIA in 2022 already consume up to 400 W, which is about 40%~ 50% higher than the previous generation processor. In 2023, Bergamo processors will consume more than 500 W. NVIDIA's new generation high-end GPU H100 chip, specially designed for AI servers, has a maximum power of up to 700 W. As the number of chips used in servers increases, the power consumption increases, and the module design complexity of the heat dissipation solution also increases.

With the upgrade of new generation GPUs and CPUs, server computing, AI image generation and e-sports applications will become the main growth drivers of the heat dissipation industry. From the perspective heat dissipation technology for the server, it is mainly divided into air cooling, liquid cooling and immersion cooling. Currently, mid-range computing servers are mainly using air cooling technology.

Due to the expanding computing power of ChatGPT or high-end AI servers, the heat dissipation capacity required must be at least higher than 700 W to be able to cope with it. For example, NVIDIA A100 or H100 AI servers are usually equipped with 4 to 8 GPUs, and each GPU will generate an additional 300 W to 700 W of heat energy. It is estimated that the thermal power consumption of the entire AI server will exceed 3000 W. In view of the fact that traditional air cooling cannot provide such high heat dissipation capabilities, thus, the industry currently uses traditional single-phase immersion cooling technology to provide the heat dissipation solution for high-density heat-generating server parts. However, it has an upper limit of 600 W.

In order to solve the heat dissipation problems, such as high thermal energy consumption, insufficient heat dissipation capacity and excessive energy consumption of high-speed computing components, the introduction of liquid cooling technology has become a new trend in heat dissipation solution. The liquid cooling heat dissipation system introduces the cooling liquid into the server, taking advantage of the fact that liquid conducts heat more efficiently than air, so that the high-density heat generated by the electronic components can be quickly transferred to the cooling liquid. Then the heat-absorbed cooling liquid is directed to the external cooling tower or heat dissipation module to further dissipate the thermal energy to the atmosphere, achieving rapid cooling and reducing energy consumption.

A common liquid cooling heat dissipation module generally comprises a liquid cooling cover and a heat sink. The heat dissipation structure of the heat sink is covered within the liquid cooling cover, and both of them are locked together through screws to form a liquid flow chamber. The liquid cooling cover has a liquid inlet and a liquid outlet. The cooling liquid can enter into the liquid flow chamber from the liquid inlet. After flowing through the heat dissipation structure, the heat-absorbed cooling liquid flows out from the liquid outlet, and is then directed through the pipeline to the external heat dissipation system to cool the liquid. By the continuous and rapid circulation of the cooling liquid, a large amount of heat generated by the heat-generating element is rapidly taken away, achieving a quick heat dissipation. However, when the metallic base plate of the heat sink is in contact with the heat-generating element, the large amount of heat rapidly generated by the heat-generating element cannot be efficiently conducted laterally to the entire area of the metallic base plate of the heat sink since the lateral heat conduction speed of the metallic base plate is limited by the cross-sectional area. This results in a large amount of heat accumulating in the local area where the heat sink is in contact with the heat-generating element. Even with application of liquid cooling, the heat dissipation capacity that can be improved is very limited.

In view of the above problems, the inventor of the present disclosure replaced the metallic base plate of the above-mentioned heat sink with a copper vapor chamber, and integrated the heat dissipation structure of the heat sink with the heat dissipation surface of the vapor chamber in an integral manner. When the heat-generating element contacts to the heat-absorbing surface of the vapor chamber, it rapidly generates a large amount of heat. The heat is then rapidly conducted to the vapor chamber. In the meantime, the working fluid existing in the internal space of the vapor chamber rapidly absorbs the heat and vaporizes into steam. Since, the heat dissipation surface of the vapor chamber is integrated with the heat dissipation structure of a heat sink, thus, as soon as the steam rises, it rapidly touches the cold heat dissipation surface integrated to the heat sink. This rapidly condenses the steam back into a working fluid again. By this rapid liquid-vapor-liquid phase transformation cycle, a large amount of heat is absorbed and then released in a fast and effective way. Compared with the traditional copper base plate, vapor chambers can laterally spread the concentrated heat more quickly to a larger area of the heat sink and thus having a larger effective heat dissipation area and faster heat dissipation.

The vapor chamber utilizes the phase transformation of the working fluid in its working chamber to rapidly dissipate heat. It is the heat dissipation method with the highest thermal conductivity at this stage. It utilizes the large amount of vaporization latent heat involved in the rapid vaporization and condensation process of the working liquid in the near-vacuum chamber to achieve rapid heat dissipation. The thermal conductivity efficiency of the vapor chamber can achieve over 10,000 W/(m2·° C.), which is dozens of times higher than which of the air convection or liquid convection. When the above-mentioned heat sink is integrated onto the heat dissipation surface of the vapor chamber in an integral manner, a large amount of heat inside the vapor chamber can be quickly and effectively conducted and dispersed to the heat dissipation structure of the heat sink, greatly improving the heat dissipation efficiency.

In addition, AI servers will be equipped with a large number of high-energy consumption chip modules and installed in computer rooms with high layout density. Under such circumstances, the surrounding environment's temperature is often high, which can easily render the air-cooling method ineffective in dissipating the large amount of heat, resulting in heat dissipation efficiency that is insufficient to meet demand.

SUMMARY

In view of the aforementioned problems, the inventor of the present disclosure proposes a liquid cooling vapor chamber heat dissipation module. More specifically, it is a more efficient liquid cooling vapor chamber heat dissipation module composed of a liquid cooling cover and an integrated vapor chamber. To explain, the liquid cooling vapor chamber heat dissipation module disclosed in this disclosure comprises a liquid cooling cover and an integrated vapor chamber. The liquid cooling cover includes a top and a sidewall connecting to the top. The sidewall surrounds the top to form an accommodating space. The sidewall is provided with at least one liquid inlet and at least one liquid outlet. The liquid inlet and the liquid outlet are connected in the accommodating space. The integrated vapor chamber includes a metallic top cover, a metallic bottom cover, a working space, a vacuum channel, a plurality of capillary structures, and a working fluid. The metallic top cover includes oppositely an outer heat-dissipating surface and an inner condensation surface. The outer heat-dissipating surface has a plurality of columnar heat-dissipating structures protruding therefrom. The inner condensation surface is surrounded by a top frame with a predetermined height, and the top frame is furnished with an upper communicative groove. The inner condensation surface has thereon a plurality of top grooves parallel to each other. The metallic bottom cover includes oppositely an outer heat-absorption surface and an inner evaporation surface. The outer heat-absorption surface is used to contact a heat-generating element. The inner evaporation surface is surrounded by a bottom frame with another predetermined height, and the bottom frame is furnished with a lower communicative groove. The inner evaporation surface has thereon a plurality of bottom grooves parallel to each other, a plurality of supporting structures protruding therefrom and disposed between the bottom grooves. The working space is formed by engaging the top frame of the metallic top cover and the bottom frame of the metallic bottom cover with the inner condensation surface of the metallic top cover to face the inner evaporation surface of the metallic bottom cover and the plurality of top grooves to overlap individually the plurality of bottom grooves. The plurality of supporting structures are protruding from the inner evaporation surface to contact individually at the inner condensation surface among the plurality of top grooves and providing support to the working space. The vacuum channel is formed by connecting spatially the upper communicative groove and the lower communicative groove so as provide a channel for vacuuming the working space. The plurality of capillary structures are disposed individually inside the plurality of bottom grooves or both top and bottom grooves. The working fluid is in the working space and the plurality of capillary structures. The entire structure of the metallic top cover including the columnar heat-dissipating structures is made as a unique piece from the same metal body, and the entire structure of the metallic bottom cover including the plurality of supporting structures is made as a unique piece from the same metal body. In addition, the liquid cooling cover is engaged with the outer heat-dissipating surface of the metallic top cover with the columnar heat-dissipating structures accommodating within the accommodating space, which allows cooling liquid to enter the accommodating space from the liquid inlet and flow through the columnar heat-dissipating structures, and then flow out from the liquid outlet.

In one embodiment of the present disclosure, a liquid cooling vapor chamber heat dissipation module is proposed, wherein the liquid cooling cover is engaged with the outer heat-dissipating surface of the metallic top cover, and the columnar heat-dissipating structures are accommodating within the accommodating space. The accommodating space is a sealed liquid-cooling chamber allowing the cooling liquid to enter into the accommodating space from the liquid inlet, flow through the columnar heat-dissipating structures to increase the cooling efficiency, and then flow out from the liquid outlet. Then, through external pipelines, the heat-absorbing cooling liquid is guided to the external heat dissipation system to dissipate the heat, cool down the cooling liquid, and then recirculate. By combining the liquid cooling cover with the integrated vapor chamber to form the liquid cooling vapor chamber heat dissipation module of the present disclosure, thus by circulating the cooling liquid, a more efficient liquid cooling can be achieved. The liquid cooling heat dissipation can improve the heat dissipation efficiency and can provide a more efficient heat dissipation solution than air cooling in high-end servers and large server rooms.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
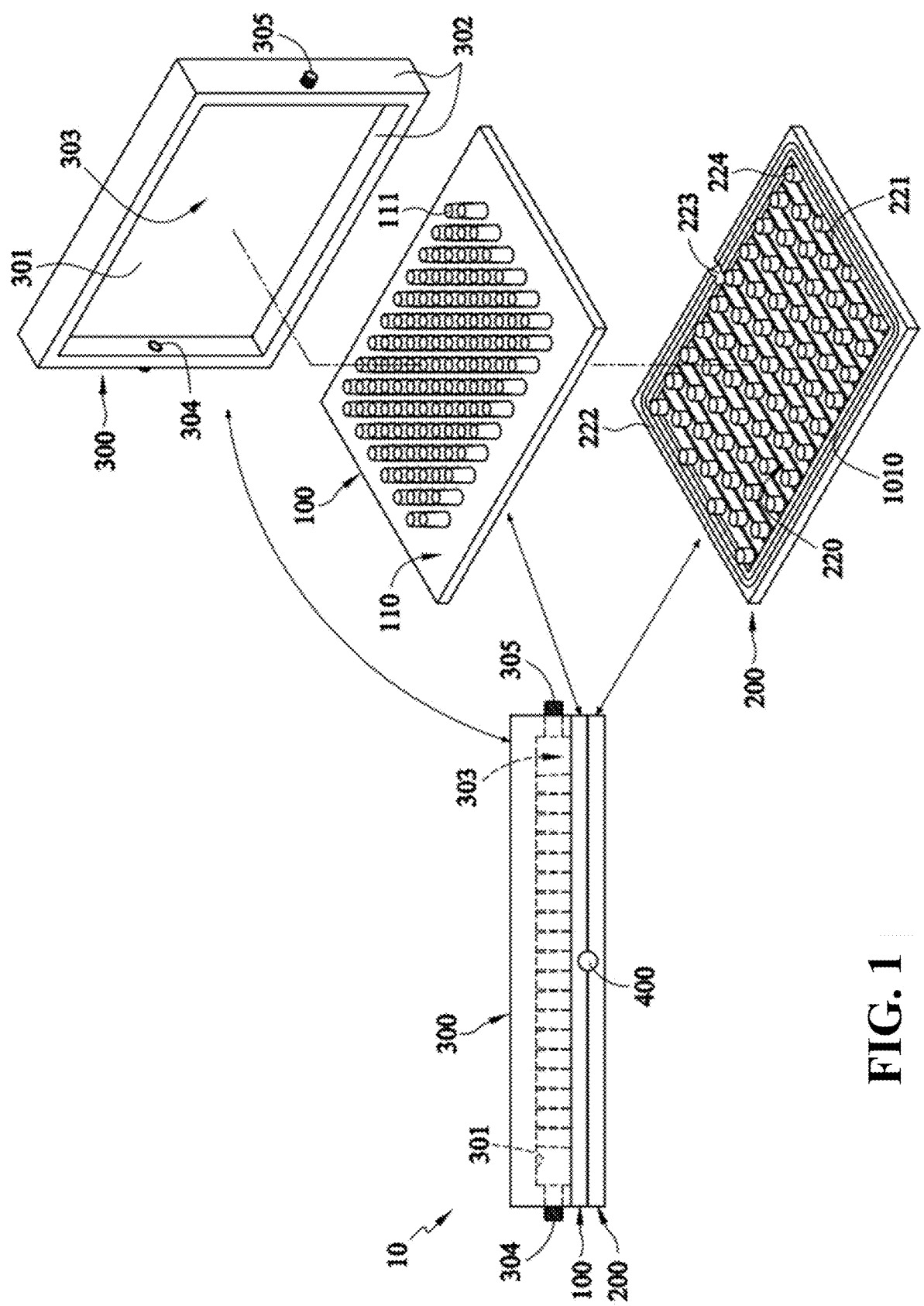
FIG. 1 shows schematically an embodiment of the liquid cooling vapor chamber heat dissipation module in accordance with this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing. In the following description and/or scope of patent application, the technical terms used should be interpreted with the usual meanings commonly used by those skilled in the art. For ease of understanding, the same elements in the following embodiments are referred to as the same symbols. In this specification, the term "about" usually means that the actual value is within plus or minus 10%, 5%, 1% or 0.5% of a specific value or range. The term "about" herein means also that the actual value falls within an acceptable standard error of the mean, as considered by one of ordinary skill in the art to which this invention pertains. Except for the examples, or unless otherwise expressly stated, it should be understood that ranges, amounts, values and percentages used herein are modified by "about". Therefore, unless otherwise stated, the numerical values or parameters disclosed in this specification and the appended patent claims are approximate numerical values and may be changed as required.

Figure 2:
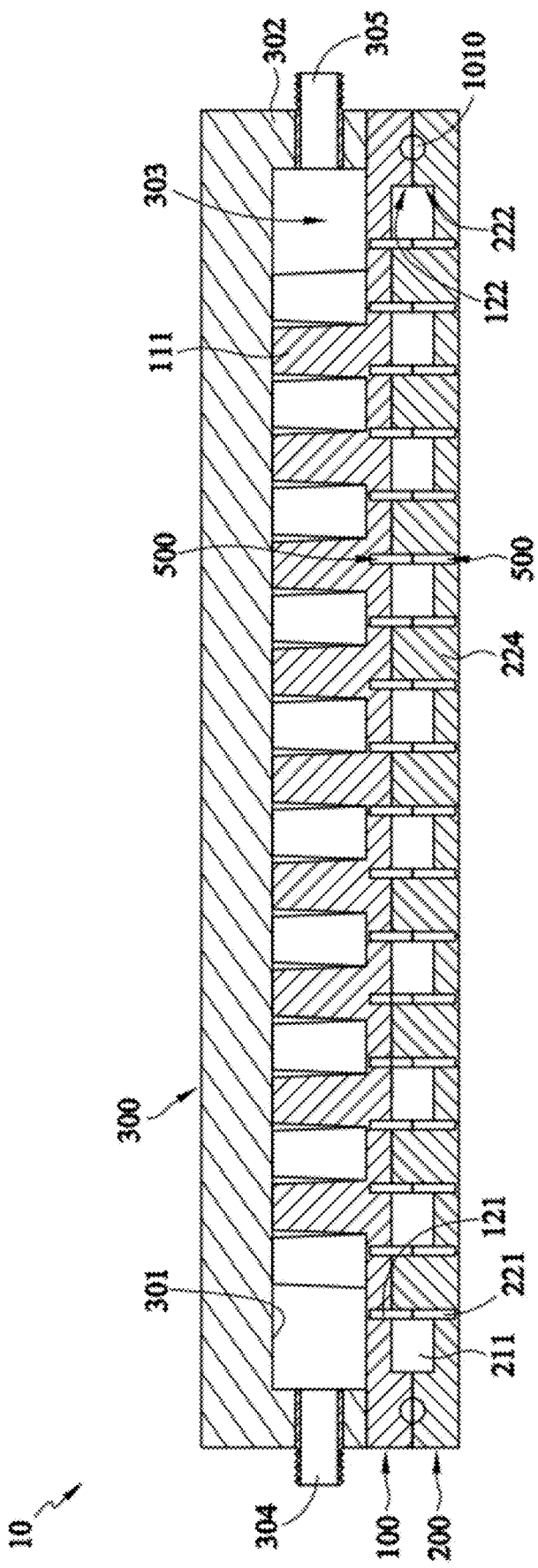
FIG. 2 shows schematically a cross-sectional view of an embodiment of the liquid cooling vapor chamber heat dissipation module in accordance with this disclosure.
Figure 3:
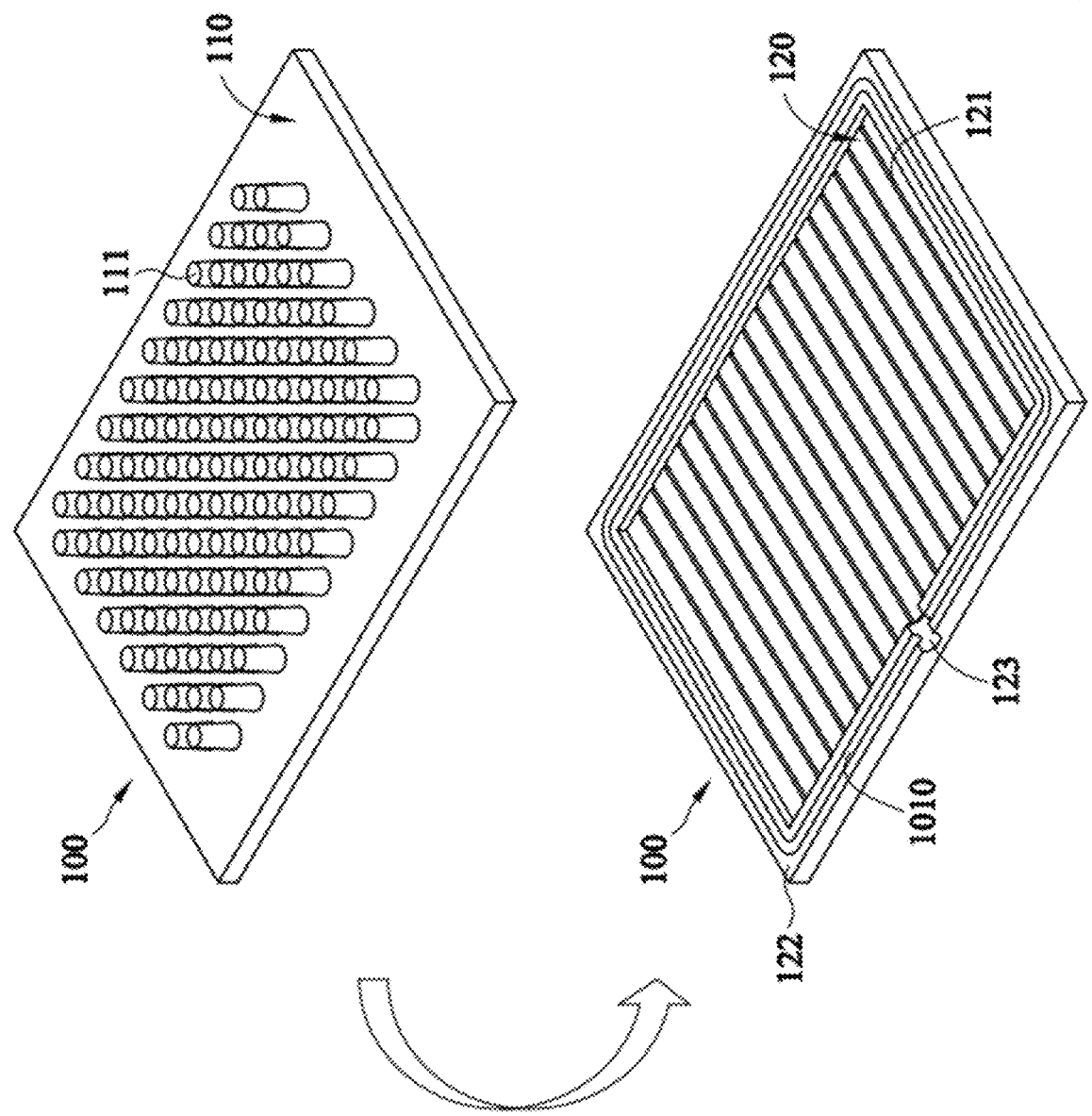
FIG. 3 shows schematically a metallic top cover structure of an embodiment of the liquid cooling vapor chamber heat dissipation module in accordance with this disclosure.
Figure 4:
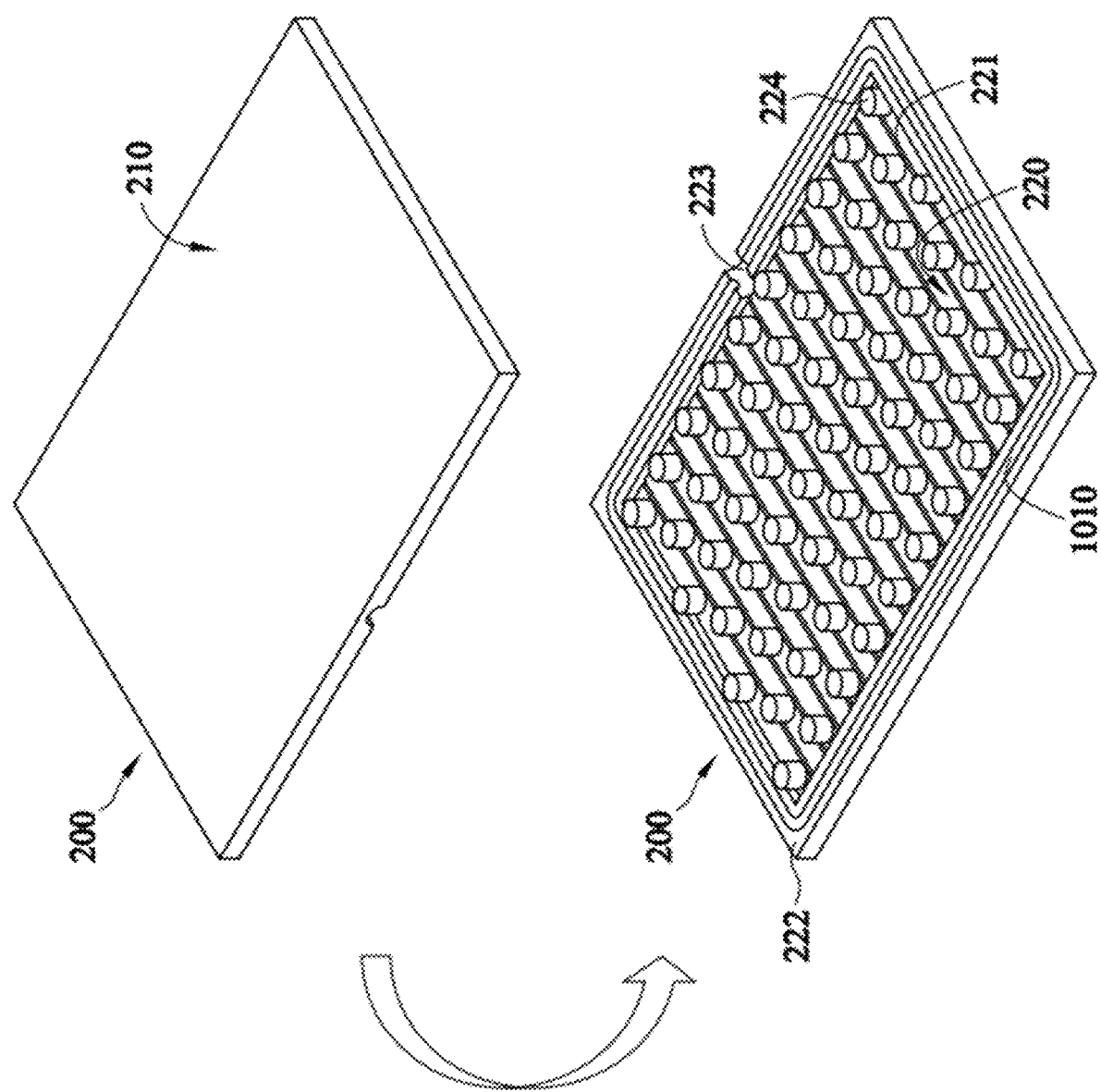
FIG. 4 shows schematically a metallic bottom cover structure of an embodiment of the liquid cooling heat dissipation module in accordance with this disclosure.

Please refer to FIG. 1 to FIG. 4. FIG. 1 shows schematically an embodiment of the liquid cooling vapor chamber heat dissipation module 10 in accordance with this disclosure. FIG. 2 shows schematically a cross-sectional view of FIG. 1. FIG. 3 shows schematically a metallic top cover 100 structure of an embodiment of the liquid cooling vapor chamber heat dissipation module 10 in accordance with this disclosure. FIG. 4 shows schematically a metallic bottom cover 200 structure of an embodiment of the liquid cooling heat dissipation module 10 in accordance with this disclosure. Referring to FIG. 1 and FIG. 2, an embodiment of a liquid cooling vapor chamber heat dissipation module 10 in accordance with this disclosure includes a liquid cooling cover 300, a metallic top cover 100 and a metallic bottom cover 200. The liquid cooling cover 300 includes a top 301 and a sidewall 302 connecting to the top 301. The sidewall 302 surrounds the top 301 to form an accommodating space 303. The sidewall 302 is provided with at least one liquid inlet 304 and at least one liquid outlet 305. The liquid inlet 304 and the liquid outlet 305 are connected in the accommodating space 303. The metallic top cover 100 (referring to FIG. 1 to FIG. 3) includes oppositely an outer heat-dissipating surface 110 and an inner condensation surface 120. The outer heat-dissipating surface 110 has a plurality of columnar heat-dissipating structures 111 protruding therefrom. The inner condensation surface 120 is surrounded by a top frame 122 with a predetermined height, and the top frame 122 is furnished with an upper communicative groove 123. The inner condensation surface 120 has thereon a plurality of top grooves 121 parallel to each other, wherein the entire structure of the metallic top cover 100 including the columnar heat-dissipating structures 111 is made as a unique piece from the same metal body. The metallic bottom cover 200 includes oppositely an outer heat-absorption surface 210 and an inner evaporation surface 220. The outer heat-absorption surface 210 is used to contact a heat-generating element. The inner evaporation surface 220 is surrounded by a bottom frame 222 with another predetermined height, and the bottom frame 222 is furnished with a lower communicative groove 223. The inner evaporation surface 220 has thereon a plurality of bottom grooves 221 parallel to each other, a plurality of supporting structures 224 protruding therefrom and disposed between the bottom grooves 221, wherein the entire structure of the metallic bottom cover 200 including the plurality of supporting structures 224 is made as a unique piece from the same metal body. The working space 211 is formed by engaging the top frame 122 of the metallic top cover 100 and the bottom frame 222 of the metallic bottom cover 200 with the inner condensation surface 120 of the metallic top cover 100 to face the inner evaporation surface 220 of the metallic bottom cover 200 and the plurality of top grooves 121 to overlap individually the plurality of bottom grooves 221. The plurality of supporting structures 224 are protruding from the inner evaporation surface 220 to contact individually at the inner condensation surface 120 among the plurality of top grooves 121 and providing support to the working space 211. The vacuum channel 400 is formed by connecting spatially the upper communicative groove 123 and the lower communicative groove 223 so as provide a channel for vacuuming the working space 211. The plurality of capillary structures 500 are disposed individually inside the plurality of bottom grooves 221 or both top and bottom grooves (121, 221). The working fluid is in the working space 211 and the plurality of capillary structures 500. The liquid cooling cover 300 is engaged with the outer heat-dissipating surface 110 of the metallic top cover 100 with the columnar heat-dissipating structures 111 accommodating within the accommodating space 303, which allows cooling liquid to enter the accommodating space 303 from the liquid inlet 304 and flow through the columnar heat-dissipating structures 111, and then flow out from the liquid outlet 305.

It should be noted that the metallic top cover 100 and the metallic bottom cover 200 are engaged to each other to from a vapor chamber. The characteristic of this vapor chamber is that the columnar heat-dissipating structures 111 are integrated on the metallic top cover 100 as to form an integrated vapor chamber.

In one embodiment of this disclosure, the top frame 122 and the bottom frame 222 of the liquid cooling vapor chamber heat dissipation module 10 further include individual welding grooves 1010 for welding the metallic top cover 100 and the metallic bottom cover 200.

Referring to FIG. 2 and FIG. 3, the metallic top cover 100 for the liquid cooling vapor chamber heat dissipation module 10 is schematically shown. In this embodiment, the liquid cooling vapor chamber heat dissipation module 10 is characterized in which the conformation and structure features of the metallic top cover 100 are directly formed on the same piece of metal. Namely, the columnar heat-dissipating structures 111 on the metallic top cover 100 and the shape of the metallic top cover 100 are all directly formed, as a unique piece, from the same metal body, not by re-sintering or welding. In other words, in this embodiment of the present disclosure, the plurality of columnar heat-dissipating structures 111 included on the outer heat-dissipating surface 110 of the metallic top cover 100 of the liquid cooling vapor chamber heat dissipation module 10 are directly formed on the outer heat-dissipating surface 110 without having any homogeneous or heterogeneous interfaces in between. In contrast to the regular prior arts, which the heat sink is pasted on the heat-dissipating surface of the vapor chamber by the heat dissipation paste, or the heat dissipation structures are formed on the heat-dissipating surface of the vapor chamber by welding or sintering. Comparing with the prior arts, in the liquid cooling vapor chamber heat dissipation module 10 of the present disclosure, the columnar heat-dissipating structures 111 are directly formed on the metallic top cover 100 of the vapor chamber, thereby, the heterogeneous interface and its heat resistance between the heat sink and the vapor chamber can be eliminated, and thus the heat-dissipating efficiency is improved.

Referring to FIG. 2 and FIG. 4, the metallic bottom cover 200 for the liquid cooling vapor chamber heat dissipation module 10 is schematically shown. In one embodiment of this disclosure, the liquid cooling vapor chamber heat dissipation module 10 is characterized in which the conformation and structure features of the metallic bottom cover 200 are directly formed on the same piece of metal. Namely, the plurality of the supporting structures 224 on the inner evaporation surface 220 of the metallic bottom cover 200 are all directly formed, as a unique piece, from the same metal body, not by re-sintering or welding. In other words, in this embodiment of the present disclosure, the plurality of the supporting structures 224 included on the inner evaporation surface 220 of the liquid cooling vapor chamber heat dissipation module 10 are directly formed on the inner evaporation surface 220 without having any homogeneous or heterogeneous interfaces in between. In contrast to the regular prior arts, which the plurality of supporting structures 224 are formed on the inner evaporation surface by sintering.

Generally speaking, in producing the one-piece metallic top cover 100 and the metallic bottom cover 200 of the aforesaid liquid cooling vapor chamber heat dissipation module 10 of the present disclosure, an etching process or a combined machining process (for example, integrating a pressing or extrusion process with a milling process) can be used, following with the sintering process. The advantage of etching is that the workpiece can be processed to have complicated structures, and thus the etching process is generally applicable to a task that a traditional process can't work on. On the other hand, the advantage of the combined machining process is that all the involved steps can be achieved by mature arts, and no additional development work is required. Nevertheless, the etching process spends a prolong process time, and usually needs a secondary process to finish a possible unsmooth surface. On the other hand, the combined machining process needs both the labors and the time.

In one embodiment of this disclosure, a cold-forging process is applied to manufacture the metallic top cover 100 and the metallic bottom cover 200 of the liquid cooling vapor chamber heat dissipation module 10. A CNC machining can also be applied for finer modification. In comparison to the etching process or the combined machining process, the cold-forging process is firstly to place a metal piece (or a metal block) into a female mode. Then, under the room temperature, a male mode is applied to repeatedly forge the metal within the female mode to form a final product. It shall be understood to the skilled in the art that the cold-forging process requires no preheating and annealing steps of a typical forging or pressing process, thus the thermal conductivity of the forged metal would not be reduced since the internal grain structure of the forged metal would not exist holes/voids and hypertrophy caused by the annealing. The cold-forged metal undergoes no heating process, thus the internal grain structure would maintain a quite dense situation, the holes or voids inside the forged metal can be greatly reduced, and the surface of the forged metal would be much smoother. In addition, rigidity and compactness of the forged metal would be further increased to reject possible deformation or distortion. After testing, the thermal conductivity and thermal diffusivity of the forged metal are higher than those of the pre-forged metal. Namely, the liquid cooling heat dissipation module 10 in accordance with this disclosure can provide better heat-dissipating efficiency than that produced by the general traditional process.

In one embodiment of this disclosure, the metallic top cover 100 of the liquid cooling vapor chamber heat dissipation module 10 is manufactured by cold-forging process, which is characterized that the shape and structure features of the metallic top cover 100 are directly made as a unique piece from a metal by a cold-forging process, including the plurality of the columnar heat-dissipating structures 111 on the outer heat-dissipating surface 110 of the metallic top cover 100.

In one embodiment of this disclosure, the metallic bottom cover 200 of the liquid cooling vapor chamber heat dissipation module 10 is manufactured by cold-forging process, which is characterized that the shape and structure features of the metallic bottom cover 200 are directly made as a unique piece from a metal body by a cold-forging process, including the plurality of supporting structures 224. In other words, similar to the metallic top cover 100, the plurality of the supporting structures 224 on the inner evaporation surface 220 of the metallic bottom cover 200 are directly formed, as a unique piece, from the same metal body of the metallic bottom cover 200 by cold-forging, not by re-sintering or welding. In one embodiment of this disclosure, each of the plurality of the supporting structures 224 is a post.

In the embodiment of the liquid cooling vapor chamber heat dissipation module 10 according to this disclosure, the material for the metallic top cover 100 and the metallic bottom cover 200 is a metallic material with superior thermal conductivity and thermal diffusivity, such as pure copper, and, after the cold-forging process, the corresponding one-piece structure can be formed. In one embodiment, the metallic material used for producing the metallic top cover 100 and the metallic bottom cover 200 is pure copper.

It should be understood for the one skilled in the art that in the aforementioned embodiments, when the pure copper is used as material for producing the metallic top cover 100 and the metallic bottom cover 200 by cold-forging process, the pure copper material is firstly placed in the mold and followed by continuous forging on the pure copper material under room temperature during the process. Therefore, the physical properties of the metallic top cover 100 and metallic bottom cover 200 obtained by cold-forging process (such as Vickers hardness, thermal conductivity and thermal diffusivity, etc.) is higher than which obtained by other machining processes (such as etching, pressing, extrusion or regular forging processes), and also higher than that of the pure copper material without cold-forging processing. In other words, when the pure copper material has been through cold-forging process, the physical properties, such as Vickers hardness, thermal conductivity, and thermal diffusivity, are higher than that of the pure copper material being through other processing methods.

The following is one exemplary example disclosed in the other disclosure by the inventor of this disclosure. In this example, the metallic top cover and the metallic bottom cover of the vapor chamber are made of pure copper, and manufactured by the cold-forging process. After having an entrusted third party (the YUANHE company) to measure Vickers hardness, thermal conductivity and thermal diffusivity of the cold-forged metal, the results are listed in Table 1 as follows, in comparison to results by the traditional combined machining process such as a process having pressing and CNC machining steps. It should be understood by the one skilled in the art that the processed material will be endowed with higher physical properties such as Vickers hardness, thermal conductivity and thermal diffusivity, which can be attributed to the characteristic of cold-forging process. It should also be understood that the degrees of the raising improvement of the aforementioned physical properties of the material are depending on the numbers and force of repeated forging against on the material during the cold-forging process. In particular, the more the numbers and force of the forging are, the higher the physical properties would be. Thus, after the cold-forging process, the aforementioned physical properties would be superior to those provided by the traditional combined machining method.

TABLE 1

|  | Cold-forging | Traditional combined machining |
|---|---|---|
| Vickers hardness (HV) | 115~117 | 85~87 |
| Thermal conductivity (W/m · K) | about 430 | about 395 |
| Thermal diffusivity (mm²/sec) | 115~117 | 85~87 |

In one exemplary example, the material for producing the metallic top cover 100 and the metallic bottom cover 200 of the liquid cooling vapor chamber heat dissipation module 10 in accordance with this disclosure is the pure copper with high thermal conductivity and thermal diffusivity. The cold-forged metallic top cover 100 and metallic bottom cover 200 would present the Vickers hardness not lower than 90 HV, 95 HV, 100 HV or 105 HV.

In another exemplary example, the material for producing the metallic top cover 100 and the metallic bottom cover 200 of the liquid cooling vapor chamber heat dissipation module 10 in accordance with this disclosure is the pure copper with high thermal conductivity and thermal diffusivity. The cold-forged metallic top cover 100 and metallic bottom cover 200 would present the thermal conductivity not lower than 400 W/(m·K), 405 W/(m·K), 408 W/(m·K), or 410 W/(m·K).

In a further exemplary example, the material for producing the metallic top cover 100 and the metallic bottom cover 200 of the liquid cooling vapor chamber heat dissipation module 10 in accordance with this disclosure is the pure copper with high thermal conductivity and thermal diffusivity. The cold-forged metallic top cover 100 and metallic bottom cover 200 would present the thermal diffusivity not smaller than 90 mm²/sec, 95 mm²/sec, 100 mm²/sec, or 105 mm²/sec.

In any of the aforementioned embodiment, the metallic top cover 100 and the metallic bottom cover 200 of the liquid cooling vapor chamber heat dissipation module 10 in accordance with this disclosure are engaged firmly by welding.

In any of the aforementioned embodiment, the working fluid used in the liquid cooling vapor chamber heat dissipation module 10 in accordance with this disclosure is pure water.

In any of the aforementioned embodiment, the working space 211 of the liquid cooling vapor chamber heat dissipation module 10 in accordance with this disclosure, after vacuuming through the vacuum channel 400 and sealing, has the air pressure less than $1\times10^{-3}$ torr, $1\times10^{-4}$ torr, or $1\times10^{-5}$ torr. It should be understood that the sealing is a commonly known technique and is not a limitation in this disclosure. For example, after the working space 211 is vacuumed to a set pressure through a metal exhaust pipe, the sealing can be made by pressing, sintering, or welding the metal exhaust pipe with a jig.

Referring to FIG. 1. In one embodiment, the liquid cooling vapor chamber heat dissipation module 10 of the present disclosure includes the liquid cooling cover 300 having at least one liquid inlet 304 and at least one liquid outlet 305, and the liquid inlet 304 and the liquid outlet 305 are arranged on different sides of the sidewall 302. As shown in FIG. 1, in this embodiment, the liquid inlet 304 and the liquid outlet 305 are disposed on opposite sides of the sidewall 302.

Figure 5:
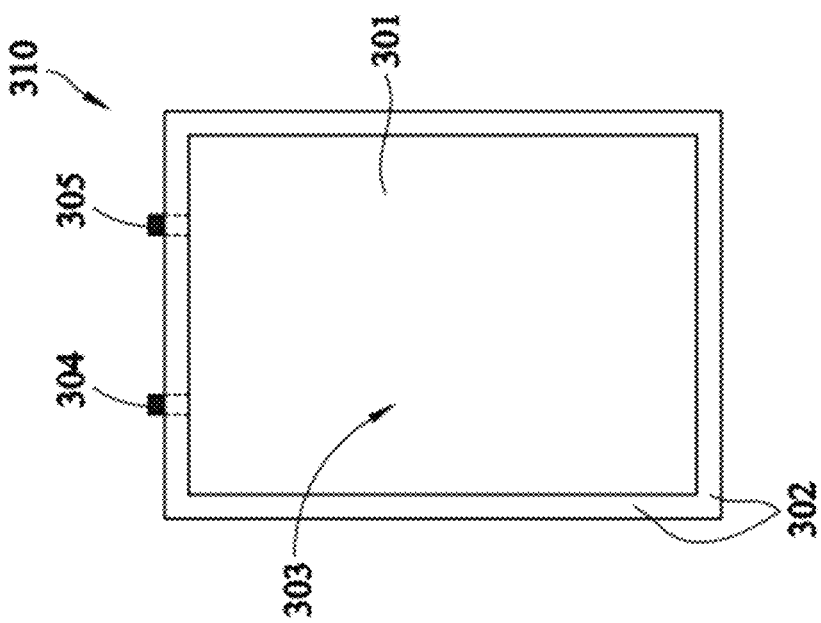
FIG. 5 shows schematically a liquid cooling cover structure of another embodiment of the liquid cooling heat dissipation module in accordance with this disclosure.
Figure 5:
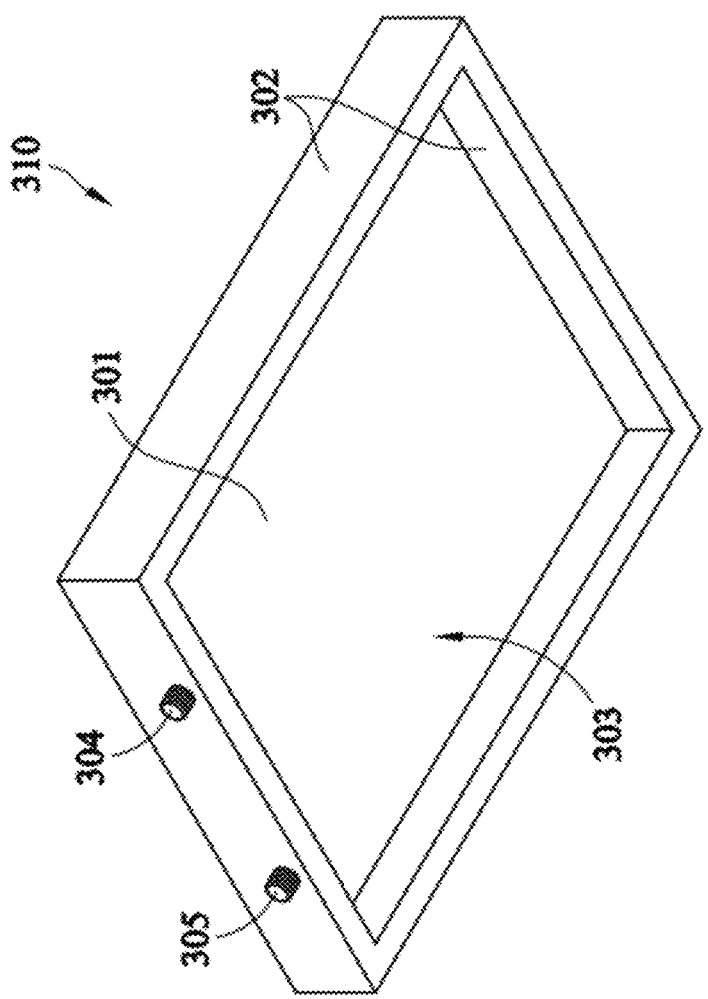

Referring to FIG. 5, which is another embodiment of the liquid cooling vapor chamber heat dissipation module 10 of the present disclosure, wherein the liquid cooling cover 310 has at least one liquid inlet 304 and at least one liquid outlet 305, and both the liquid inlet 304 and the liquid outlet 305 are disposed on the same side of the sidewall 302 of the liquid cooling cover 310.

It should be noted that in order to match with the arrangement or stacking of server machines, the liquid cooling cover 300 or 310 of the liquid cooling vapor chamber heat dissipation module 10 of the present disclosure has at least one liquid inlet 304 and at least one liquid outlet 305, and the liquid inlet 304 and the liquid outlet 305 can be arranged at the same side or different sides of the sidewall 302 according to customer needs. In another embodiment, in order to accelerate the flow rate of cooling liquid and improve cooling efficiency, the number of liquid inlets 304 is 2 or more, and the number of liquid outlets 305 is also 2 or more. The number of liquid inlets 304 and the number of liquid outlets 305 may be equal or unequal, and the liquid inlets 304 and the liquid outlets 305 may be partly on the same side and partly on different sides.

Figure 6:
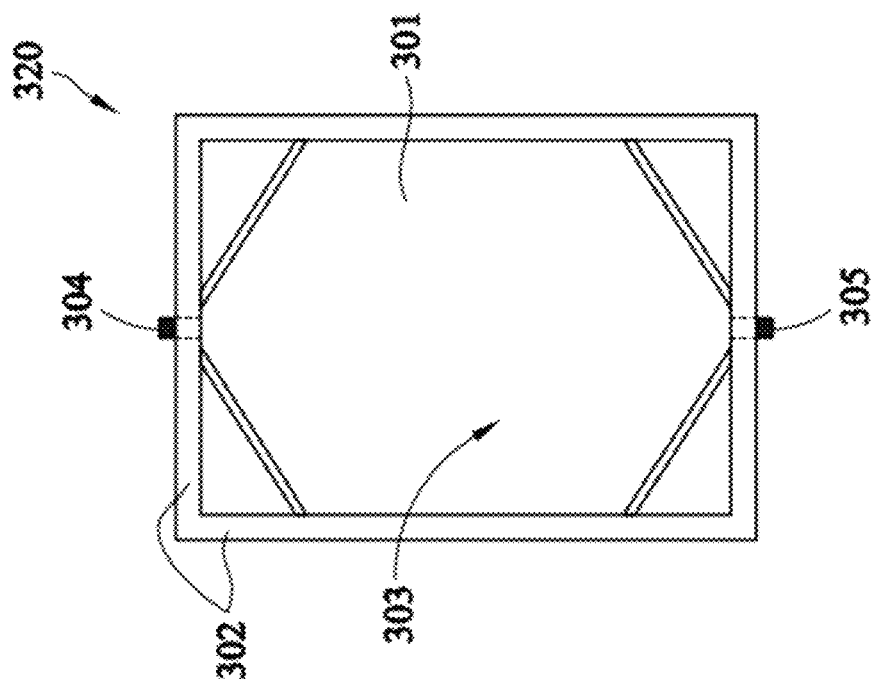
FIG. 6 shows schematically a liquid cooling cover structure of yet another embodiment of the liquid cooling heat dissipation module in accordance with this disclosure.
Figure 6:
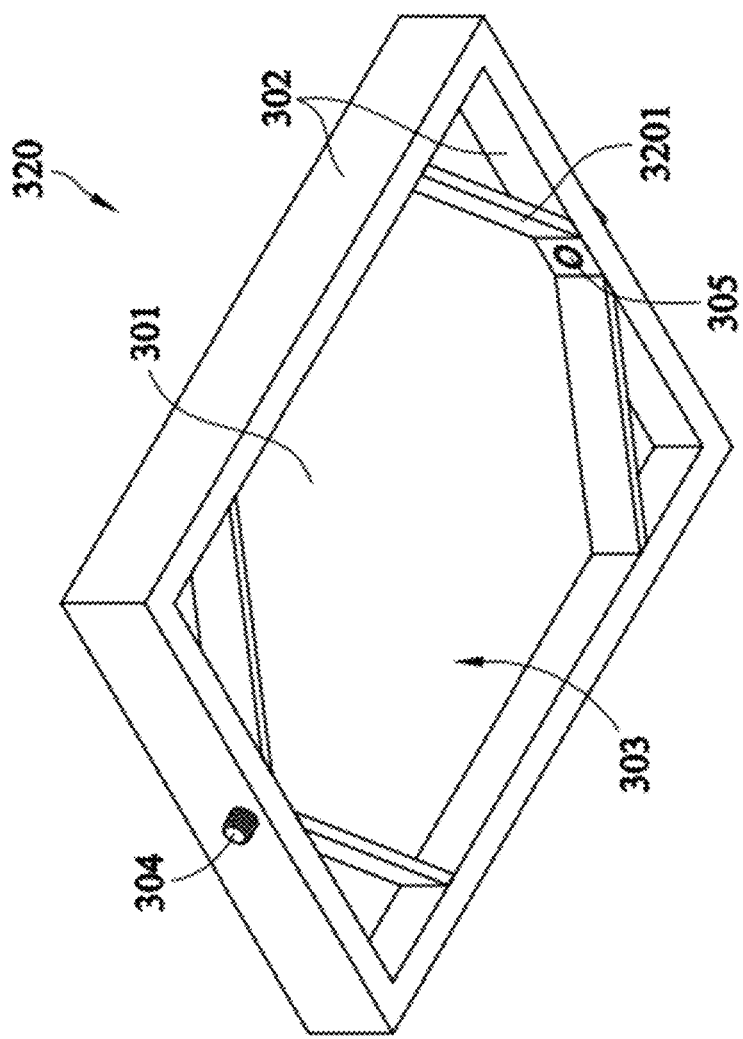
Figure 7:
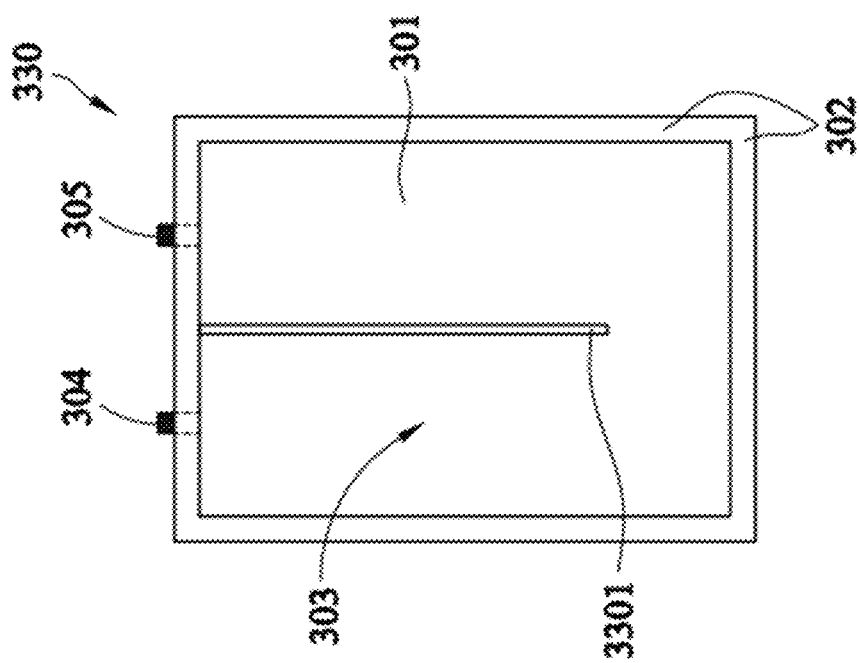
FIG. 7 schematically a liquid cooling cover structure of still another embodiment of the liquid cooling heat dissipation module in accordance with this disclosure.
Figure 7:
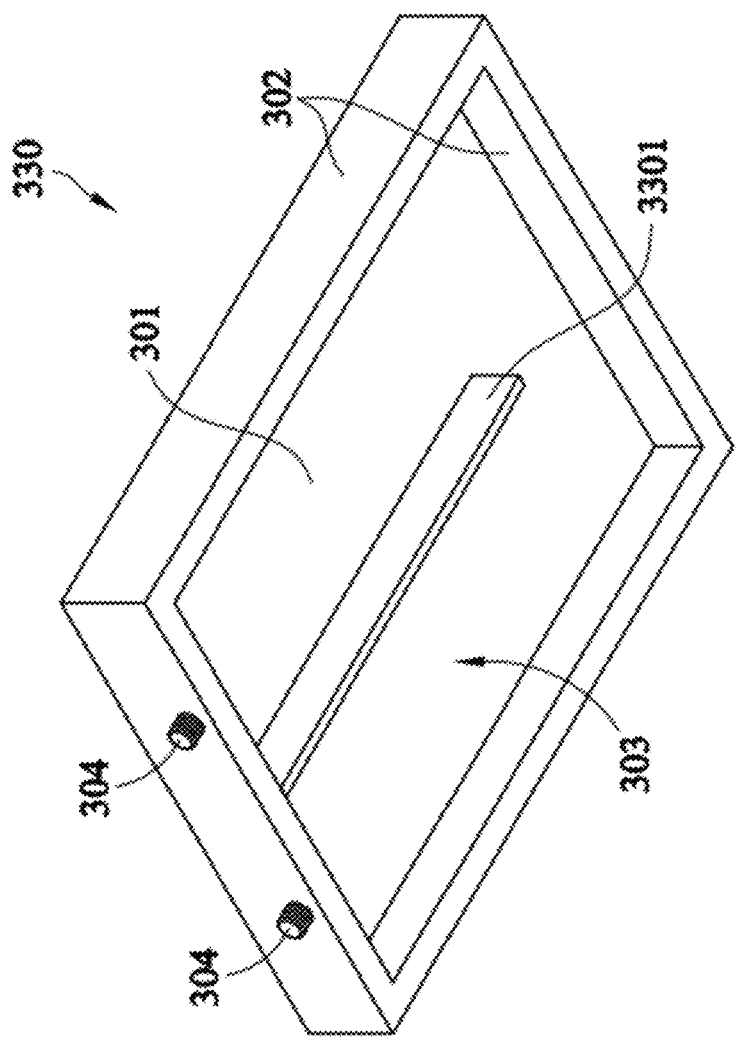

In order to further improve the heat dissipation efficiency of the liquid cooling vapor chamber heat dissipation module 10 of the present disclosure, the inventor proposes another embodiment of the liquid cooling cover 320 and 330, which is characterized that the accommodating space 303 is further provided with at least one flow guide 3201, 3301, so that the cooling liquid can be quickly and evenly directed to flow through and between the plurality of columnar heat-dissipating structures 111 after entering the accommodating space 303 from the liquid inlet 304. The cooling liquid can therefore take away the heat absorbed by the plurality of columnar heat-dissipating structures 111 rapidly, and then flow out from the liquid outlet 305 and flow to the external heat dissipation system. The flow guide 3201, 3301 can prevent the cooling liquid from forming turbulent flow or uneven temperature inside the accommodating space 303, thereby further improving heat dissipation efficiency. Referring to FIG. 6, in one embodiment of this disclosure, in the liquid cooling cover 320 of the liquid cooling vapor chamber heat dissipation module 10, the liquid inlet 304 and the liquid outlet 305 are respectively disposed on the opposite sides of the sidewall 302 and both are respectively provided with a pair of flow guide 3201 within the accommodating space 303. The pair of flow guide 3201 are extend to both sides with the liquid inlet 304 and the liquid outlet 305 as the center, forming a V-shaped setup. It should be mentioned that if the columnar heat-dissipating structures 111 are arranged in a high density at the middle area of the heat dissipation outer surface 110 and the flow guide is not provided, the cooling liquid will be hindered by the columnar heat-dissipating structures 111 and flow to both sides of the accommodating space 303 when it enters into the accommodation space 303 from the liquid inlet 304. As a result, the flow rate of the cooling liquid between the columnar heat-dissipating structures 111 will be relatively slow, causing the cooling liquid in the middle area having higher temperature than other area. Thus, the benefit, the high heat dissipation efficiency, of liquid cooling cannot be achieved. Therefore, a pair of flow guide 3201 are set at the liquid inlet 304 and the liquid outlet 305 to guide the cooling liquid from the liquid inlet 304 to flow through the columnar heat-dissipating structures 111 to improve the heat dissipation efficiency. Referring to FIG. 7, in another one embodiment of this disclosure, when the liquid inlet 304 and the liquid outlet 305 are disposed on the same side of the sidewall 302 of the liquid cooling cover 330, a flow guide 3301 can be set between the liquid inlet 304 and the liquid outlet 305 in the accommodating space 303, thereby to allow the cooling liquid to flow quickly and evenly between the columnar heat-dissipating structures 111, and take away the heat rapidly, and then smoothly flow out from the liquid outlet 305 to the external heat dissipation system.

It should be noted that the liquid cooling covers 300, 310, 320 and 330 disclosed in any of the above embodiments are illustrative and are not intended to limit the scope of the liquid cooling vapor chamber heat dissipation module 10 of the present disclosure. By referring to the embodiments of the present disclosure, those of ordinary skill in the technical field of the present disclosure can modify the quantity, positions, sizes, and shapes of flow guide according to actual application conditions to improve the flow pattern of the cooling liquid, and thus the heat dissipation efficiency can be improved.

In any of the above-mentioned embodiments, the liquid cooling vapor chamber heat dissipation module 10 of the present disclosure, wherein the liquid covers 300, 310, 320 and 330 are engaged and welded to the heat dissipation outer surface 110 of the metallic top cover 100.

Certainly, each of the above-mentioned embodiments is only for illustration and not limiting the scope of the present disclosure, and any equivalent modification or change made according to the liquid cooling heat dissipation module of the above-mentioned embodiments shall still be included in the patent scope of the present disclosure.

It is worth mentioning that most of the existing heat dissipation modules adopt external heat sinks. Such a combined module structure would have an additional thermal resistance attributed to the heterogeneous heat conduction interface prior to the heat sink, leading to reducing the efficiency of the heat dissipation module. The liquid cooling heat dissipation module according to this disclosure integrates the metallic top cover of the vapor chamber and the heat sink structure into one unique piece, so that the heat dissipation efficiency of the vapor chamber is not restricted by the thermal resistance of the conduction interface. The adoption of the liquid cooling cover allows the vapor chamber to be paired with liquid cooling, further improving its heat dissipation efficiency. In addition, the installation of large server rooms and high-density high-end chip modules often causes the surrounding temperature to be too high, resulting in low air cooling efficiency. The liquid cooling vapor chamber heat dissipation module disclosed in this disclosure adopts liquid cooling for heat dissipation, the heat dissipation efficiency is not affected by the surrounding temperature of the computer room or machine. In addition, the position and quantity of the liquid inlet and liquid outlet can also be arranged depending on how the servers or chip modules are stacked, making the overall heat dissipation solution more systematic and efficient. Additionally, the metallic top cover and the metallic bottom cover of the liquid cooling heat dissipation module of this disclosure can be made by cold-forging process in addition to regular etching process or combined machining process. The cold-forging process can endow the processed material with finer grain structure and reduce internal defects such as holes/voids, so that the material can obtain higher strength, deformation resistance and fatigue resistance. Also, the thermal conductivity and thermal diffusion efficiency of the material can be improved. Thereupon, the resulted liquid cooling heat dissipation module would be superior to general heat dissipation modules with similar structures in terms of heat dissipation efficiency, durability and reliability.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A liquid cooling vapor chamber heat dissipation module, comprising:

a liquid cooling cover, including a top and a sidewall connecting to the top, the top being surrounded by the sidewall to form an accommodating space, the sidewall being provided with at least one liquid inlet and at least one liquid outlet, wherein the liquid inlet and the liquid outlet being connected in the accommodating space;

a metallic top cover, including oppositely an outer heat-dissipating surface and an inner condensation surface, the outer heat-dissipating surface having a plurality of columnar heat-dissipating structures protruding therefrom, the inner condensation surface being surrounded by a top frame with a predetermined height, the top frame being furnished with an upper communicative groove, the inner condensation surface having thereon a plurality of top grooves parallel to each other, wherein the metallic top cover and the plurality of columnar heat-dissipating structures are made as a unique piece from a metal body;

a metallic bottom cover, including oppositely an outer heat-absorption surface and an inner evaporation surface, the outer heat-absorption surface being used to contact a heat-generating electronic element, the inner evaporation surface being surrounded by a bottom frame with another predetermined height, the bottom frame being furnished with a lower communicative groove, the inner evaporation surface having thereon a plurality of bottom grooves parallel to each other, a plurality of supporting structures protruding therefrom and disposed individually among the plurality of bottom grooves, wherein the metallic bottom cover and the plurality of supporting structures are made as a unique piece from another metal body;

a working space, being formed by engaging the top frame of the metallic top cover and the bottom frame of the metallic bottom cover with the inner condensation surface of the metallic top cover to face the inner evaporation surface of the metallic bottom cover, the plurality of top grooves to overlap individually the plurality of bottom grooves, the plurality of supporting structures protruding from the inner evaporation surface to contact individually at the inner condensation surface among the plurality of top grooves and providing support to the working space;

a vacuum channel being formed by connecting spatially the upper communicative groove and the lower communicative groove so as provide a channel for vacuuming the working space;

a plurality of capillary structures, disposed individually inside the plurality of bottom grooves or both top grooves and bottom grooves; and a working fluid, being in the working space and the plurality of capillary structures;

wherein, the liquid cooling cover is engaged with the outer heat-dissipating surface of the metallic top cover with the columnar heat-dissipating structures accommodating within the accommodating space, allowing a cooling liquid to enter the accommodating space from the liquid inlet and flow through the columnar heat-dissipating structures, and then flow out from the liquid outlet.

2. The liquid cooling vapor chamber heat dissipation module of claim 1, wherein the metallic top cover and the plurality of columnar heat-dissipating structures are made as a unique piece from a metal by a cold-forging process, and the metallic bottom cover and the plurality of supporting structures are also made as a unique piece from another metal by the cold-forging process.

3. The liquid cooling vapor chamber heat dissipation module of claim 1, wherein the metal is pure copper.

4. The liquid cooling vapor chamber heat dissipation module of claim 2, wherein the metal is pure copper, and each of the metallic top cover and the metallic bottom cover has Vickers hardness not lower than 90 HV.

5. The liquid cooling vapor chamber heat dissipation module of claim 2, wherein the metal is pure copper, and each of the metallic top cover and the metallic bottom cover has thermal conductivity not lower than 400 W/(m·K).

6. The liquid cooling vapor chamber heat dissipation module of claim 2, wherein the metal is pure copper, and each of the metallic top cover and the metallic bottom cover has thermal diffusivity not smaller than 90 mm$^2$/sec.

7. The liquid cooling vapor chamber heat dissipation module of claim 2, wherein each of the plurality of supporting structures is a post.

8. The liquid cooling vapor chamber heat dissipation module of claim 2, wherein the metallic top cover and the metallic bottom cover are engaged firmly by welding.

9. The liquid cooling vapor chamber heat dissipation module of claim 2, wherein the working fluid is pure water.

10. The liquid cooling vapor chamber heat dissipation module of claim 2, wherein an air pressure of the working space is less than $1 \times 10^{-3}$ torr.

11. The liquid cooling vapor chamber heat dissipation module of claim 2, wherein the liquid inlet and the liquid outlet are disposed on the same side or different sides of the sidewall of the liquid cooling cover.

12. The liquid cooling vapor chamber heat dissipation module of claim 2, wherein the liquid inlet and the liquid outlet are male threaded joints protruding from the sidewall or threaded holes penetrating the sidewall.

13. The liquid cooling vapor chamber heat dissipation module of claim 2, wherein the accommodating space is provided with at least one flow guide.

14. The liquid cooling vapor chamber heat dissipation module of claim 2, wherein the liquid cooling cover and the outer heat dissipation surface of the metallic top plate are engaged firmly by welding.

* * * * *